United States Patent
Kim et al.

(10) Patent No.: US 10,276,589 B2
(45) Date of Patent: Apr. 30, 2019

(54) METHOD OF MANUFACTURING SEMICONDUCTOR DEVICE

(71) Applicants: Hyung Joon Kim, Yongin-si (KR); Yong Seok Cho, Seoul (KR); BiO Kim, Seoul (KR); Jung Ho Kim, Seongnam-si (KR); Joong Yun Ra, Hwaseong-si (KR); Sung Hae Lee, Suwon-si (KR)

(72) Inventors: Hyung Joon Kim, Yongin-si (KR); Yong Seok Cho, Seoul (KR); BiO Kim, Seoul (KR); Jung Ho Kim, Seongnam-si (KR); Joong Yun Ra, Hwaseong-si (KR); Sung Hae Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 6 days.

(21) Appl. No.: 15/499,291

(22) Filed: Apr. 27, 2017

(65) Prior Publication Data

US 2018/0122821 A1 May 3, 2018

(30) Foreign Application Priority Data

Nov. 3, 2016 (KR) .......................... 10-2016-0145697

(51) Int. Cl.
*H01L 27/11582* (2017.01)
*H01L 21/02* (2006.01)
(Continued)

(52) U.S. Cl.
CPC .. *H01L 27/11582* (2013.01); *H01L 21/02178* (2013.01); *H01L 21/02356* (2013.01); *H01L 21/28282* (2013.01); *H01L 21/31111* (2013.01); *H01L 21/31122* (2013.01); *H01L 29/513* (2013.01); *H01L 29/517* (2013.01); *H01L 27/11565* (2013.01)

(58) Field of Classification Search
None
See application file for complete search history.

(56) References Cited

U.S. PATENT DOCUMENTS 5,059,448 A * 10/1991 Chandra ............. C23C 18/1208
257/E21.262
7,687,371 B2   3/2010 Sheen et al.
(Continued)

FOREIGN PATENT DOCUMENTS

KR   2012-0047119 A   5/2012

*Primary Examiner* — Eva Y Montalvo
*Assistant Examiner* — Kevin Quinto
(74) *Attorney, Agent, or Firm* — Volentine, Whitt & Francos, PLLC

(57) ABSTRACT

A method of manufacturing a semiconductor device includes forming a mold structure including alternately stacked mold insulating and sacrificial layers on a substrate, forming a vertical structure through the mold structure, forming side openings by removing the sacrificial, forming a preliminary dielectric layer in the side openings, forming a dielectric layer by heat-treating the preliminary dielectric layer, removing a surface layer of the dielectric layer, forming a first conductive layer covering the dielectric layer in the side openings, and forming a second conductive layer covering the first conductive layer and filling the side openings.

14 Claims, 19 Drawing Sheets

(51) Int. Cl.
  *H01L 21/28* (2006.01)
  *H01L 21/311* (2006.01)
  *H01L 29/51* (2006.01)
  H01L 27/11565 (2017.01)

(56) References Cited

U.S. PATENT DOCUMENTS

| | | |
|---|---|---|
| 8,062,978 B2 | 11/2011 | Choi et al. |
| 8,084,819 B2 | 12/2011 | Kim et al. |
| 8,697,524 B2 | 4/2014 | You et al. |
| 9,385,139 B2 | 7/2016 | Chang et al. |
| 2009/0261395 A1* | 10/2009 | Boescke ............... G11C 11/22 257/295 |
| 2012/0104482 A1 | 5/2012 | Kim et al. |
| 2013/0143407 A1* | 6/2013 | Lin ..................... B81C 1/0038 438/694 |
| 2014/0302683 A1* | 10/2014 | Kikuchi ........... H01L 21/31116 438/718 |
| 2015/0132915 A1 | 5/2015 | Park et al. |
| 2017/0125436 A1* | 5/2017 | Sharangpani ..... H01L 27/11582 |

* cited by examiner

METHOD OF MANUFACTURING SEMICONDUCTOR DEVICE

PRIORITY STATEMENT

This application claims priority to Korean Patent Application No. 10-2016-0145697 filed on Nov. 3, 2016 in the Korean Intellectual Property Office, the disclosure of which is incorporated herein by reference in its entirety.

BACKGROUND

1. Field

The present inventive concept relates to a method of manufacturing a semiconductor device. In particular, the present inventive concept relates to the forming of gate structures, such as those of 3D memory cell arrays or of planar transistors, in the manufacturing of semiconductor devices.

2. Description of Related Art

The size of electronic products is gradually being reduced even though such products are still required to process large amounts of data. Therefore, the degree of integration of semiconductor memory devices used in electronic products must be increased. In order to increase the degree of integration of semiconductor memory devices, memory devices including a planar structure of memory cells including transistors have been continuously scaled down. However, there are limits on the degree to which a planar array of memory cells can be scaled down. Recently, so-called three-dimensional (3D) memory devices including a stacked structure of memory cells including transistors have been proposed as a way to increase the degree of integration of semiconductor memory devices beyond that which can be attained in a memory device including a planar structure of memory cells.

SUMMARY

According to an aspect of the present inventive concept, there is provide a method of manufacturing a semiconductor device comprising forming a mold structure including alternately stacked mold insulating layers and sacrificial layers on a substrate, forming a vertical structure extending through the mold structure, forming side openings by removing the sacrificial layers, forming a preliminary dielectric layer in the side openings, forming a dielectric layer by heat-treating the preliminary dielectric layer, removing a surface layer of the dielectric layer, forming a first conductive layer covering the dielectric layer in the side openings; and forming a second conductive layer covering the first conductive layer and filling a remainder of the side openings.

According to another aspect of the present inventive concept, there is provided a method of manufacturing a semiconductor device comprising forming a metal oxide film in an amorphous state, on a substrate, crystallizing the metal oxide film, removing a surface layer of the metal oxide film that is crystallized, forming a first conductive layer covering the metal oxide film, and forming a second conductive layer covering the first conductive layer.

According to still another aspect of the present inventive concept, there is provided a method of manufacturing a semiconductor device comprising forming a gate dielectric on a substrate, and forming a gate electrode, and in which the forming of the gate dielectric includes sequentially forming layers of different dielectric materials including an amorphous metal oxide film, heat-treating the amorphous metal oxide film until the amorphous metal oxide film crystallizes, and etching away the surface layer of the metal oxide film that has crystallized, and in which the forming of the gate electrode includes forming a layer of metal against the metal oxide film from which the surface layer has been etched away.

BRIEF DESCRIPTION OF THE DRAWINGS

The above and other aspects, features and other advantages of the present inventive concept will be more clearly understood from the following detailed description when taken in conjunction with the accompanying drawings, in which.

DETAILED DESCRIPTION

Hereinafter, the present inventive concept will be described in detail with reference to the attached drawings.

Figure 1:
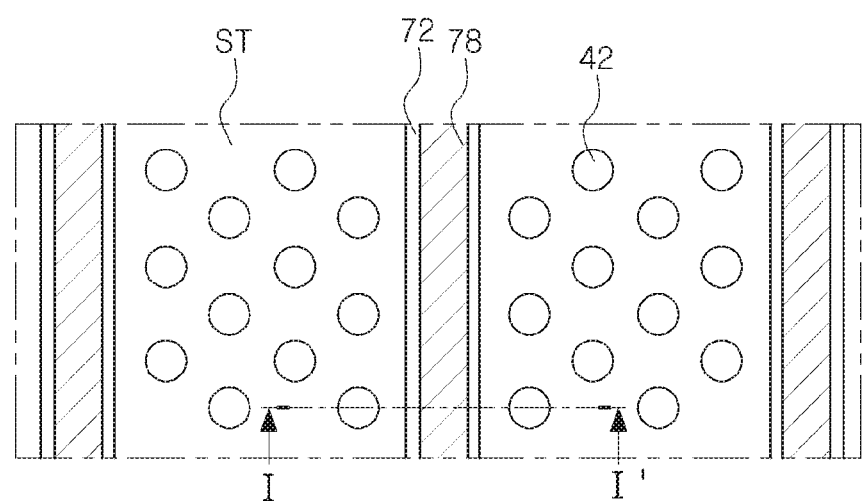
FIG. 1 is a plan view of an example of a semiconductor device according to the present inventive concept.
Figure 2:
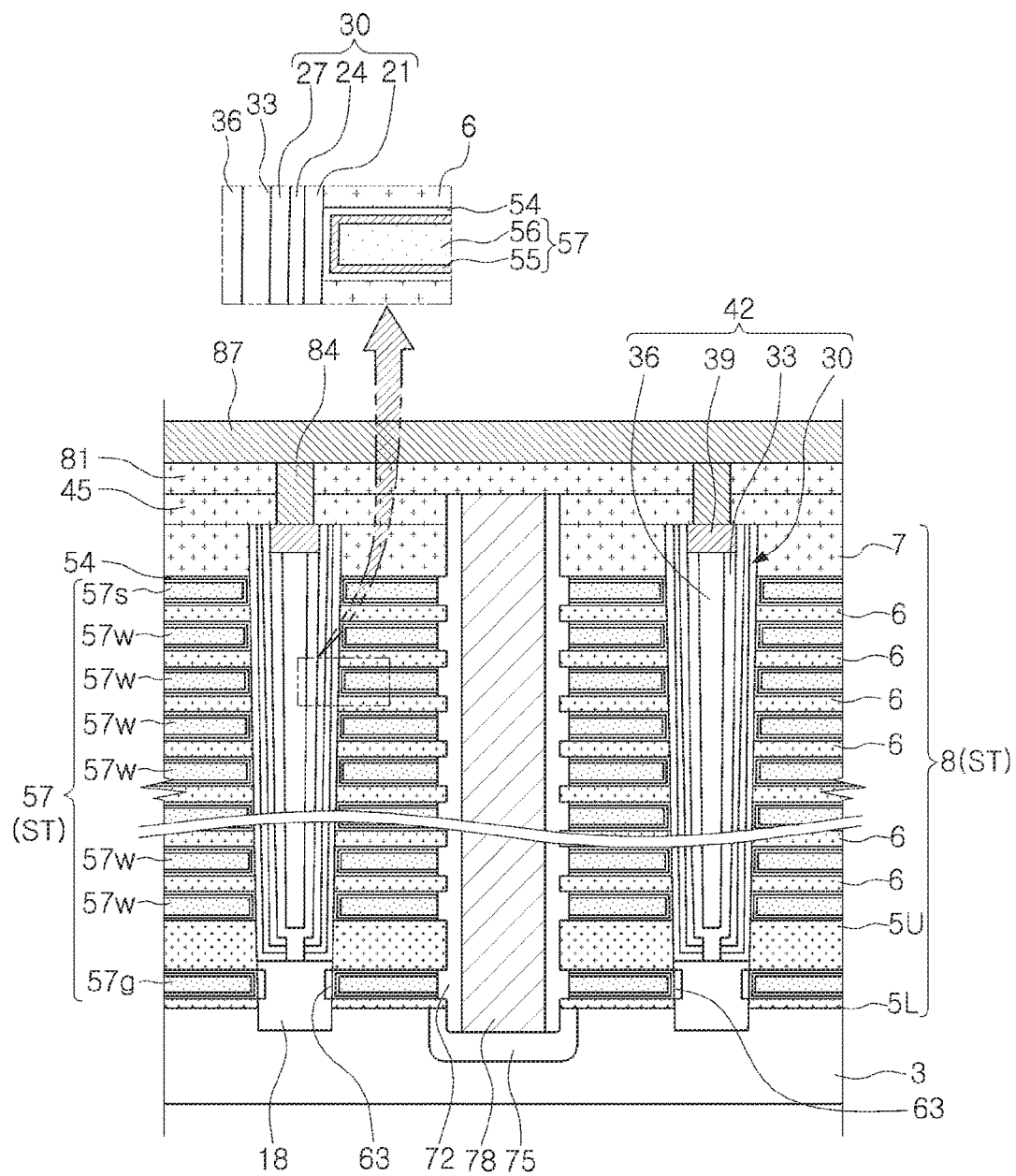
FIG. 2 is a cross-sectional view of the semiconductor device taken along line I-I' of FIG. 1.

FIG. 1 is a plan view of an example of a semiconductor device according to the present inventive concept, while FIG. 2 is a cross-sectional view taken along line I-I' of FIG. 1.

With reference to FIGS. 1 and 2, the semiconductor device may include a substrate 3, a stacked structure ST, a vertical structure 42, and a separation pattern 78. The semiconductor device may further include a bit line 87 electrically connected to a contact plug 84.

The substrate 3 may include a semiconductor material, such as a group IV semiconductor material, a group III-V compound semiconductor material or a group II-VI compound semiconductor material. For example, the substrate 3 may be a single crystal silicon substrate or a silicon on insulator (SOI) substrate.

The stacked structure ST may be disposed on the substrate 3. The stacked structure ST may include mold insulating layers 8 and conductive patterns 57. The conductive patterns 57 may be interposed between the mold insulating layers 8. The mold insulating layers 8 and the conductive patterns 57 may be alternately and repeatedly stacked on the substrate 3.

In an example, the conductive patterns 57 may include select gate electrodes, and cell gate electrodes 57w.

A lowermost one of the select gate electrodes 57g may be provided as a ground select gate electrode or a ground select line GSL. In addition, an uppermost one of the select gate electrodes 57s may be provided as a string select gate electrode or a string select line SSL.

The cell gate electrodes 57w may be disposed between the uppermost select gate electrode 57s and the lowermost select gate electrode 57g. The cell gate electrodes 57w may be provided as word lines of a memory cell array. The cell gate electrodes 57w may be spaced apart from each other in a direction perpendicular to the substrate 3.

The mold insulating layers 8 may include a first lower mold insulating layer 5L disposed between the lowermost select gate electrode 57g and the substrate 3, a second lower mold insulating layer 5U disposed between the lowermost select gate electrode 57g and a lowermost cell gate electrode among the cell gate electrodes 57w, intermediate mold insulating layers 6 disposed between the cell gate electrodes 57w and between an uppermost cell gate electrode among the cell gate electrodes 57w and the uppermost select gate electrode 57s, and an upper mold insulating layer 7 on the uppermost select gate electrode 57s. The first lower mold insulating layer 5L may be thinner than each of the intermediate mold insulating layers 6. The second lower mold insulating layer 5U and the upper mold insulating layer 7 may be thicker than each of the intermediate mold insulating layers 6.

The vertical structure 42 may be disposed in a channel hole 15 extending through the stacked structure ST. In other words, the vertical structure 42 may penetrate through the stacked structure ST. A width of the channel hole 15 may gradually decrease in a direction toward the substrate 3.

The vertical structure 42 may include a semiconductor layer 33 elongated in a direction perpendicular to an upper surface of the substrate 3 and a dielectric structure 30 disposed between the semiconductor layer 33 and the stacked structure ST.

The dielectric structure 30 may include a first dielectric layer 21, a second dielectric layer 24, and a third dielectric layer 27, formed in the channel hole 15 in the foregoing sequence. The second dielectric layer 24 may be interposed between the first dielectric layer 21 and the third dielectric layer 27. The second dielectric layer 24 may be in contact with the first dielectric layer 21 and the third dielectric layer 27. The third dielectric layer 27 may be in contact with the semiconductor layer 33. The first dielectric layer 21 may be provided as a barrier dielectric layer or a blocking dielectric layer. In more detail, the first dielectric layer 21 may include a silicon oxide. The second dielectric layer 24 may be provided as a charge storage layer. The second dielectric layer 24 may be provided as a charge trapping layer. The second dielectric layer 24 may include a silicon nitride, a silicon oxynitride, a silicon-rich silicon oxide, or the like. The third dielectric layer 27 may be provided as a tunnel oxide layer. The third dielectric layer 27 may be silicon oxide or a silicon oxide-based dielectric.

The vertical structure 42 may further include a gap-fill insulating layer 36 and a conductive pad 39 on the gap-fill insulating layer 36. The gap-fill insulating layer 36 may be disposed on the semiconductor layer 33, and may be in contact therewith. The gap-fill insulating layer 36 may be an insulating material, such as a silicon oxide. The conductive pad 39 may be a conductive material, such as polysilicon having an n-type impurity (conductivity).

A semiconductor pattern 18 may be disposed in the channel hole 15. The semiconductor pattern 18 may be disposed below the vertical structure 42. The semiconductor pattern 18 may be an epitaxial layer grown from the substrate 3 using a selective epitaxial growth (SEG) process. The semiconductor pattern 18 may be disposed below the semiconductor layer 33, and may be in contact therewith. An insulating layer 63 may be disposed between the semiconductor pattern 18 and the lowermost select gate electrode 57g. The insulating layer 63 may be in contact with the semiconductor pattern 18. The insulating layer 63 may be a silicon oxide.

A fourth dielectric layer 54 may be interposed between the conductive patterns 57 and the mold insulating layers 8. The fourth dielectric layer 54 may extend between the conductive patterns 57 and the dielectric structure 30. The fourth dielectric layer 54 may form a blocking dielectric together with the first dielectric layer 21. Alternatively, the first dielectric layer 21 may be provided as a barrier dielectric, while the fourth dielectric layer 54 may be provided as the blocking dielectric.

The fourth dielectric layer 54 may be formed of a high-k dielectric material. In more detail, the high-k dielectric material may be formed of one material selected from the group consisting of aluminum oxide ($Al_2O_3$), tantalum oxide ($Ta_2O_5$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). The fourth dielectric layer 54 may be formed of a crystallized aluminum oxide.

A first upper insulating layer 45 may be disposed on the stacked structure ST and the vertical structure 42. The first upper insulating layer 45 may be formed of an insulating material, such as a silicon oxide, or the like.

The separation pattern 78 may be disposed on the substrate 3. The separation pattern 78 may extend vertically to divide the first upper insulating layer 45 and the stacked structure ST into respective sections. In an example, the separation pattern 78 may be a conductive material. An insulating spacer 72 may be interposed between the stacked structure ST and the separation pattern 78.

An impurity region 75 may be disposed in the substrate 3 below the separation pattern 78. The impurity region 75 may have a conductivity type different from that of a body of the substrate 3 disposed directly adjacent to, i.e., bordering, the impurity region 75. For example, the impurity region 75 may have n-type conductivity, while the body of the substrate 3 disposed directly adjacent to the impurity region 75 may have p-type conductivity.

The impurity region 75 and the conductive pad 39 may have the same conductivity type. For example, the impurity region 75 and the conductive pad 39 may have n-type conductivity. The conductive pad 39 may be provided as a drain region, while the impurity region 75 may be provided as a source region.

The vertical structure 42 extending through the stacked structure ST may be provided in multiples, i.e., a plurality of vertical structures 42 may be provided. In more detail, the vertical structures 42 may be arranged horizontally in a staggered pattern alongside the separation pattern 78.

A second upper insulating layer 81 may be disposed on the first upper insulating layer 45 and the separation pattern 78. A contact plug 84 may extend through the first upper insulating layer 45 and the second upper insulating layer 81 and be electrically connected to the conductive pad 39 of the vertical structure 42. The bit line 87 electrically connected to the contact plug 84 may be disposed on the second upper insulating layer 81.

FIGS. 3A to 3H illustrate an example of a method of manufacturing a semiconductor device according to the present inventive concept. Hereinafter, the method of FIGS. 3A to 3H will be described in connection with the manufacturing of the semiconductor device illustrated in FIGS. 1 and 2. FIGS. 3A to 3H are cross-sectional views taken in the same direction as line I-I' of FIG. 1.

Figure 3A:
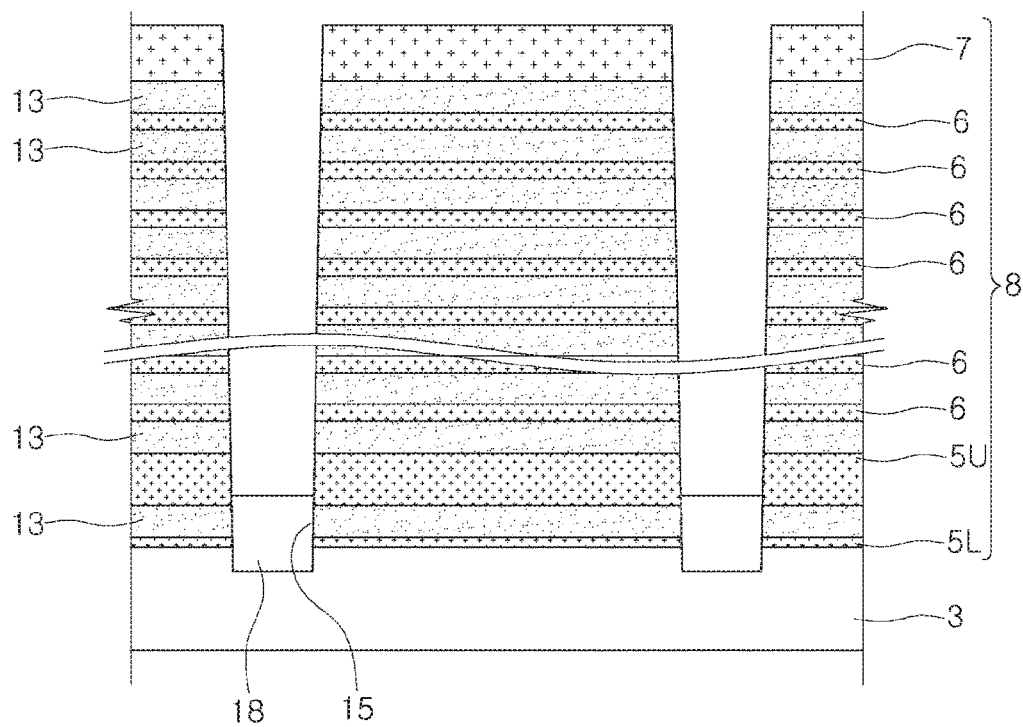
FIGS. 3A, 3B, 3C, 3D, 3E, 3F, 3G and 3H are cross-sectional views of the semiconductor device during the course of its manufacture and together illustrate an example of a method of manufacturing a semiconductor device according to the present inventive concept.

With reference to FIG. 3A, a substrate 3 may be provided. The substrate 3 may be a semiconductor substrate. Mold insulating layers 8 and sacrificial layers 13 may be formed alternately and repeatedly on the substrate 3. The mold insulating layers 8 and the sacrificial layers 13 may form a mold structure. The mold insulating layers 8 may be formed using a material having etching selectivity with respect to the sacrificial layers 13. For example, the mold insulating layers 8 may be formed of a silicon oxide, while the sacrificial layers 13 may be formed of a silicon nitride.

The mold insulating layers 8 may include a first lower mold insulating layer 5L, a second lower mold insulating layer 5U on the first lower mold insulating layer 5L, a plurality of intermediate mold insulating layers 6 on the second lower mold insulating layer 5U, and an upper mold insulating layer 7 on the plurality of intermediate mold insulating layers 6.

The first lower mold insulating layer 5L may be thinner than each of the plurality of intermediate mold insulating layers 6. The second lower mold insulating layer 5U may be thicker than each of the plurality of intermediate mold insulating layers 6. The upper mold insulating layer 7 may be thicker than each of the plurality of intermediate mold insulating layers 6. The sacrificial layers 13 may be formed to substantially the same thicknesses.

A channel hole 15 may be formed through the mold structure, that is, the mold insulating layers 8 and the sacrificial layers 13, and exposes the substrate 3. The channel hole 15 may be formed in multiples, i.e., a plurality of channel holes may be formed. Each channel hole 15 may extend into the substrate 3. Each channel hole 15 may have an upper portion wider than a lower portion thereof. One channel hole 15 will be referred to in the following for ease of description.

A semiconductor pattern 18 may be formed in a lower region of the channel hole 15 in such a manner that an SEG process is performed using the substrate 3 as a seed layer. The semiconductor pattern 18 may be a silicon epitaxial layer. An upper surface of the semiconductor pattern 18 may be disposed to be higher than a lower surface of the second lower mold insulating layer 5U and lower than an upper surface of the second lower mold insulating layer 5U.

Figure 3B:
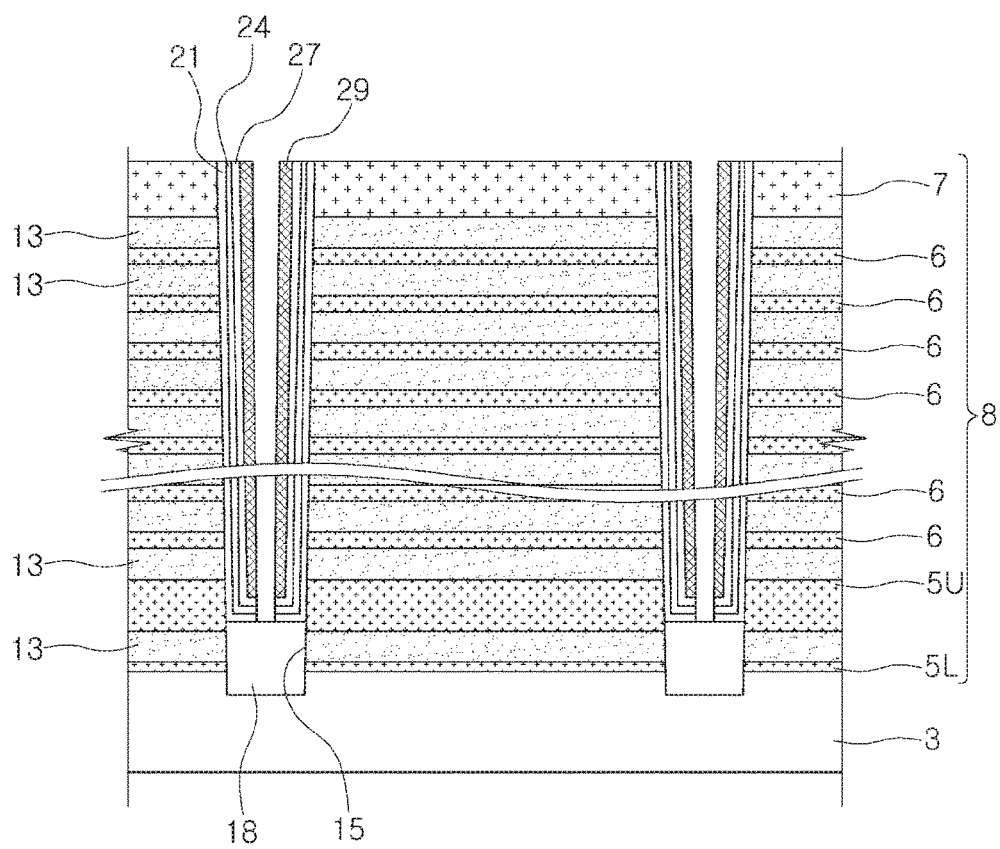

With reference to FIG. 3B, a first dielectric layer 21, a second dielectric layer 24, and a third dielectric layer 27 may be formed in sequence, on the substrate 3 including the channel hole 15 and the semiconductor pattern 18. A sacrificial spacer layer 29 may be formed on the third dielectric layer 27 in the channel hole 15, and the first dielectric layer 21, the second dielectric layer 24, and the third dielectric layer 27 may be anisotropically etched using the sacrificial spacer layer 29 as an etching mask, thus exposing the semiconductor pattern 18.

Figure 3C:
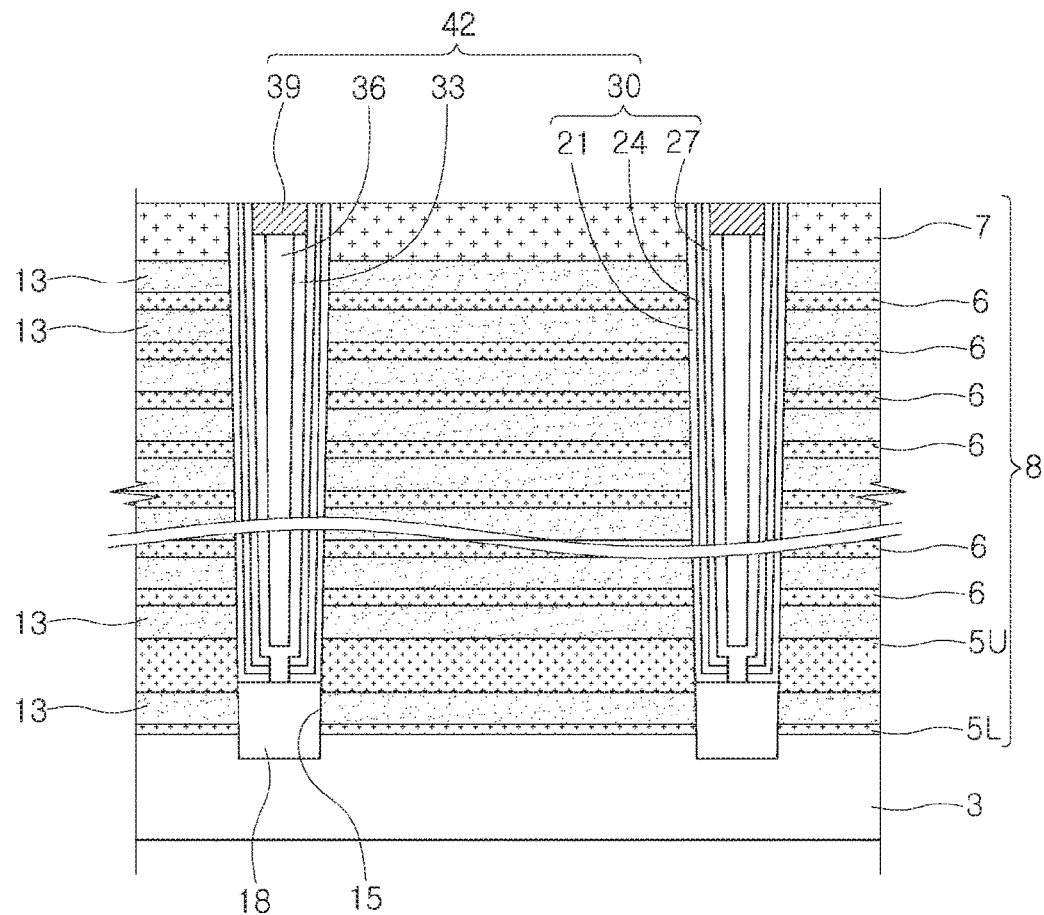

With reference to FIG. 3C, the sacrificial spacer layer 29 may be removed, and the semiconductor layer 33 may be formed. The semiconductor layer 33 may be connected to the semiconductor pattern 18. In a case in which the sacrificial spacer layer 29 is removed, an upper portion of the semiconductor pattern 18 may be partially etched, thus forming a recessed region. In this case, the recess defined by the recessed region may be filled with the semiconductor layer 33. In an example, the sacrificial spacer layer 29 is not removed, and the semiconductor layer 33 is formed.

A gap-fill insulating layer 36 may be formed on the sacrificial layer 33 to partially fill the channel hole 15, and a conductive pad 39 may be formed to fill the remaining portion of the channel hole 15 and contact the sacrificial layer 33.

The first dielectric layer 21, the second dielectric layer 24, and the third dielectric layer 27 may form a dielectric structure 30. The conductive pad 39, the semiconductor layer 33, the gap-fill insulating layer 36, and the dielectric structure 30 may form a vertical structure 42.

Figure 3D:
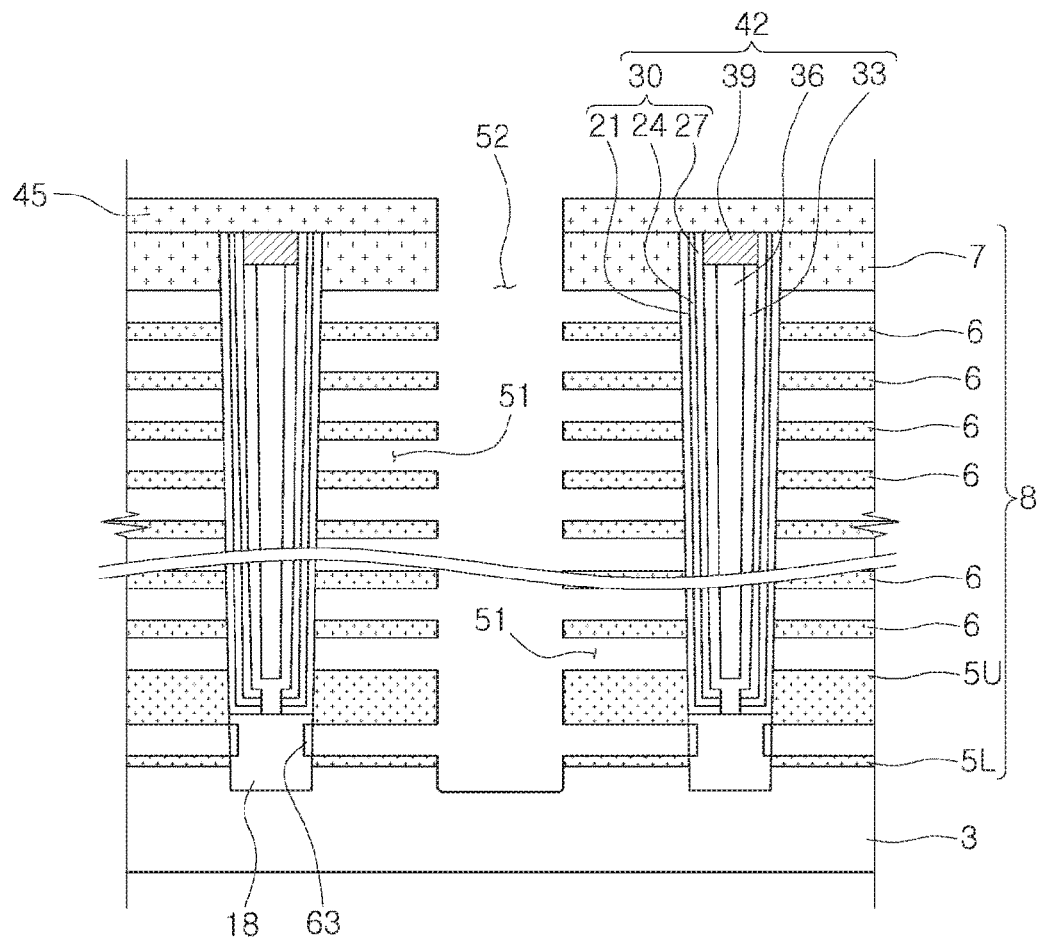

With reference to FIG. 3D, a first upper insulating layer 45 may be formed as covering the vertical structure 42 and the upper mold insulating layer 7. A separation trench 52 may be formed vertically through the first upper insulating layer 45, the mold insulating layers 8, and the sacrificial layers 13, to separate the same into respective sections. Subsequently, the sacrificial layers 13 exposed by the separation trench 52 may be selectively removed, thus forming side openings 51. In more detail, in a case in which the sacrificial layers 13 are formed of a silicon nitride and the mold insulating films 140 are formed of a silicon oxide, an isotropic etching process using an etchant including phosphoric acid may be performed. The side openings 51 may be extended horizontally from the separation trench 52 to the mold insulation layers 7, thus exposing a portion of side walls of vertical structures 42 and the semiconductor pattern 18. An insulating layer 63 may be formed by an oxidation process on a side wall of the semiconductor pattern 18 exposed by a side opening 51.

Figure 3E:
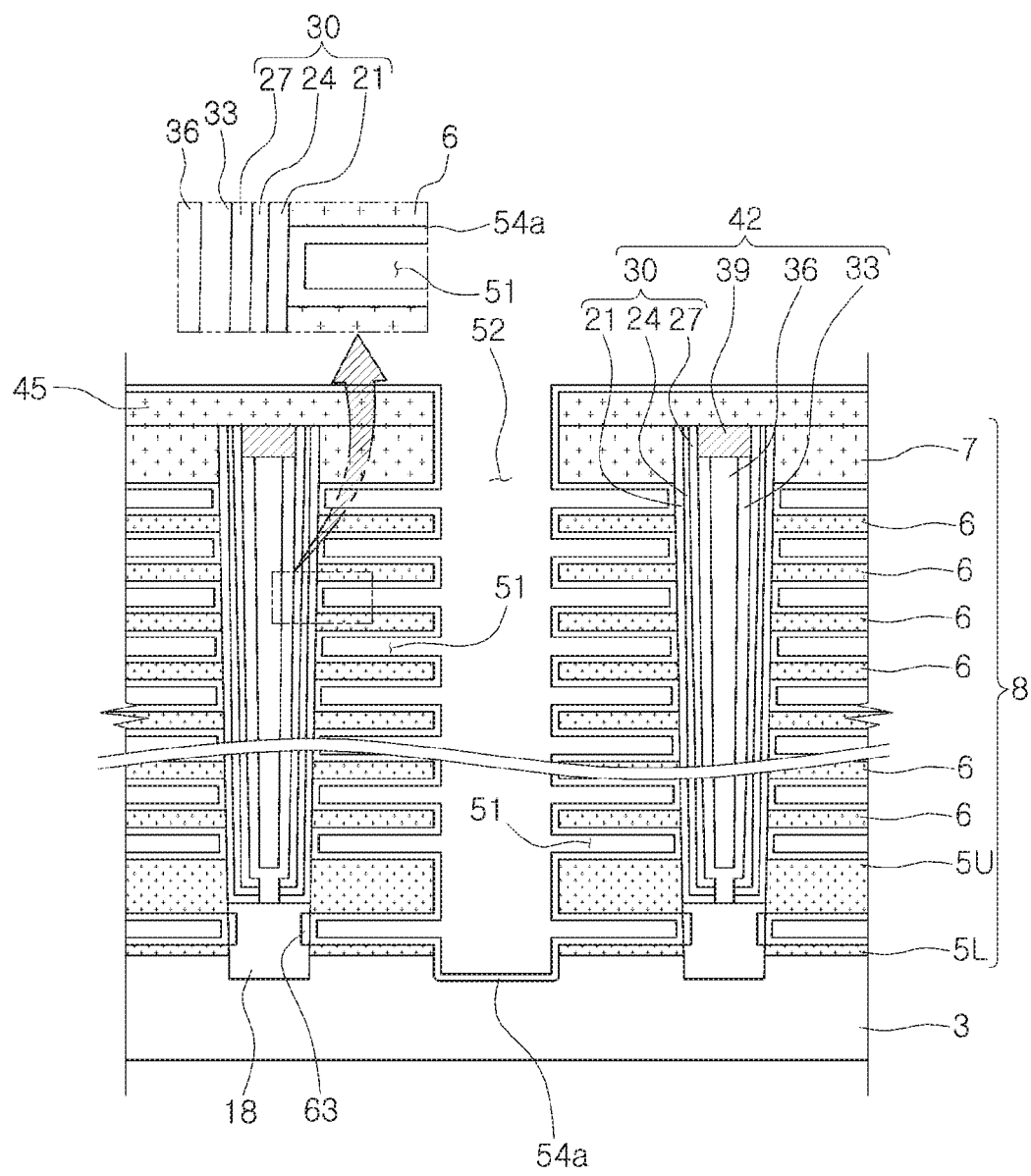

With reference to FIG. 3E, a preliminary dielectric layer 54a may be formed in the side openings 51. The preliminary dielectric layer 54a may be an amorphous metal oxide film. In more detail, the amorphous metal oxide film may be an amorphous aluminum oxide film.

Figure 3F:
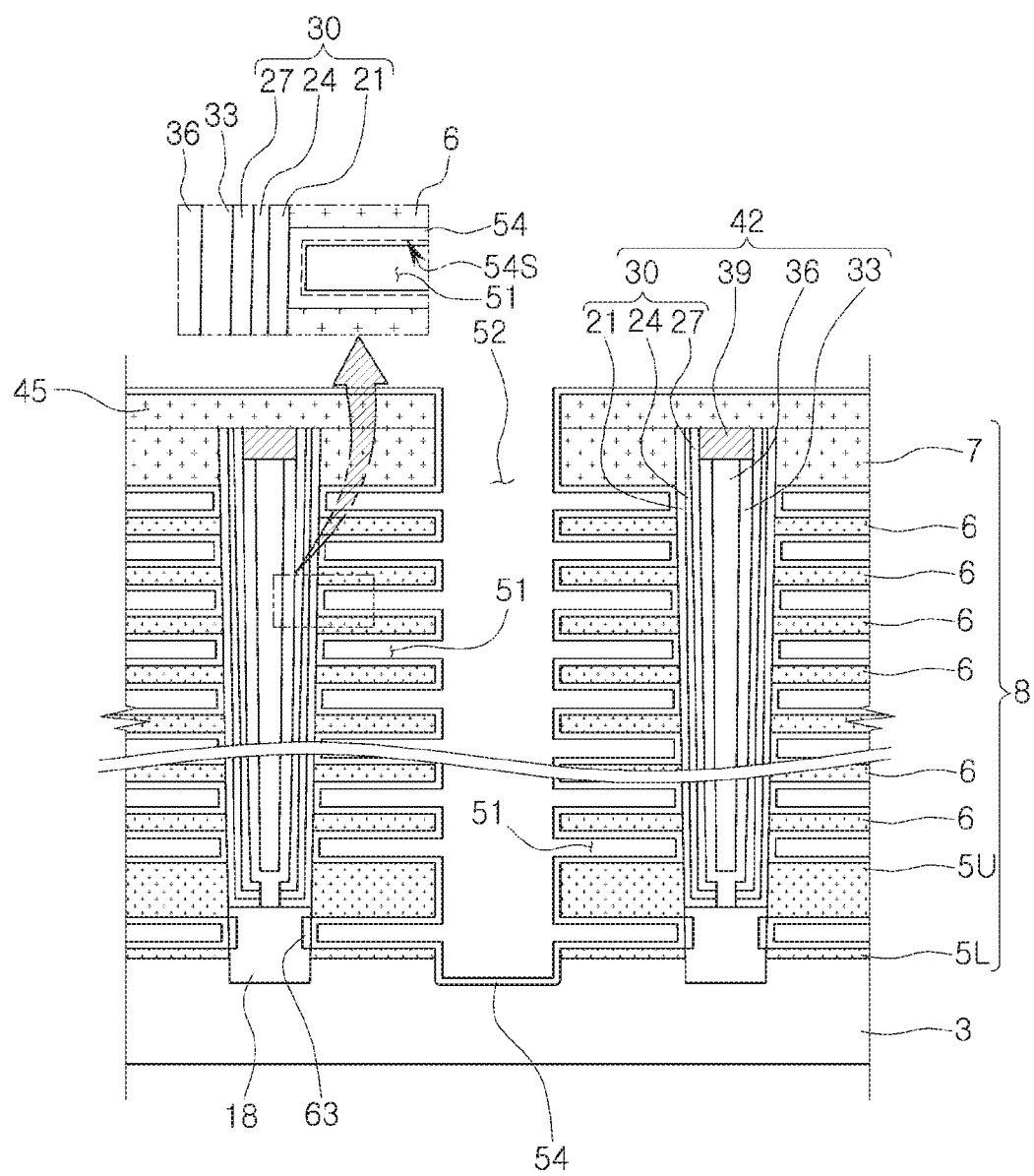

With reference to FIG. 3F, the preliminary dielectric layer (54a of FIG. 3E) may be heat-treated. The heat treatment may be a spike rapid thermal annealing performed in an inert gas atmosphere or an oxygen atmosphere crystallizing the preliminary dielectric layer 54a in such a manner that a fourth dielectric layer 54 is formed.

The fourth dielectric layer 54 may include a surface layer 54s having a lower degree of crystallization than that of a bulk layer (of the same material). That is, here, the term "bulk layer" refers to the portion of the fourth dielectric layer 54 beneath the surface layer 54s. The surface layer 54s may have an etching rate higher than that of the bulk layer.

Figure 3G:
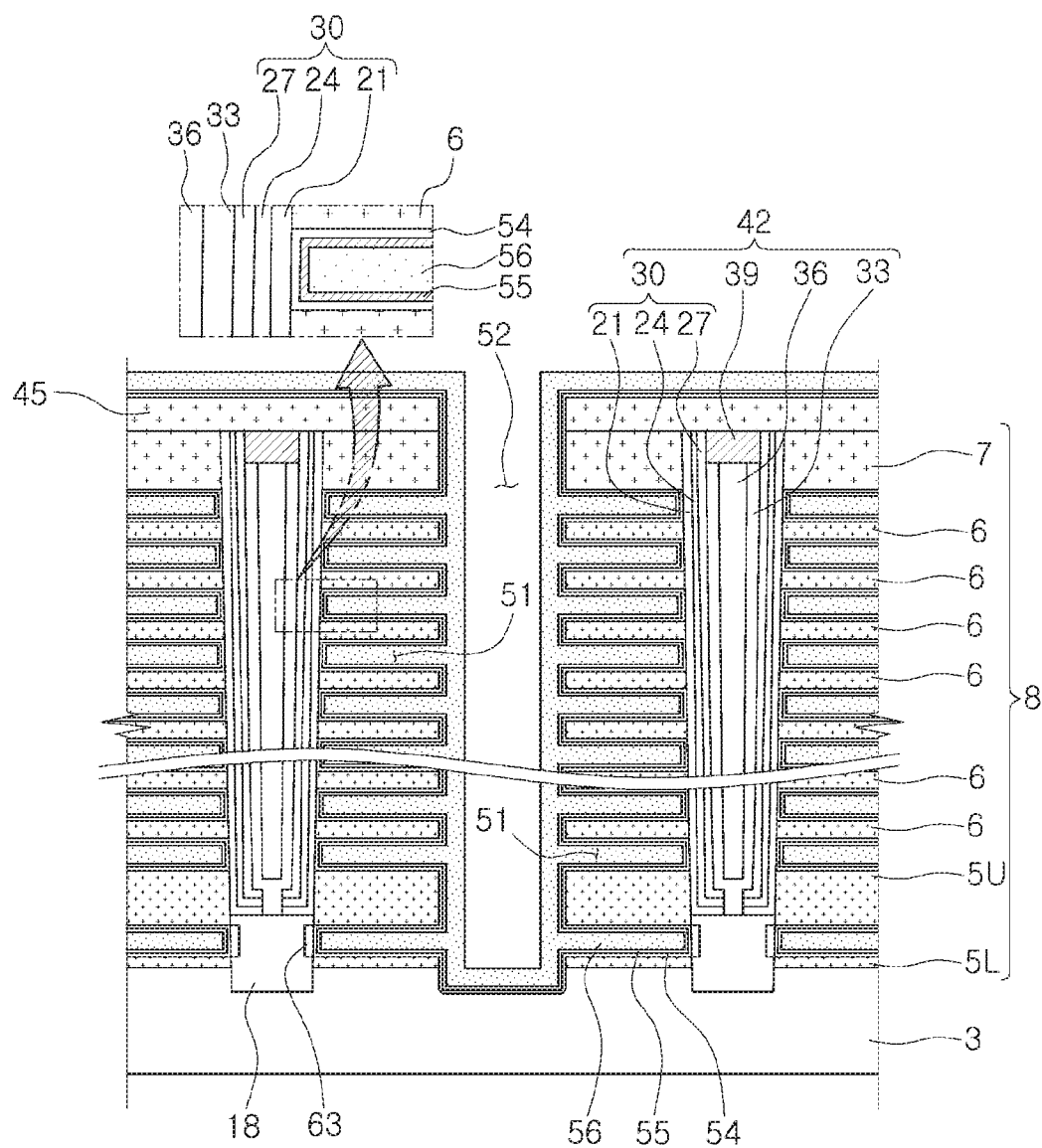

With reference to FIG. 3G, a first conductive layer 55 may be formed covering the fourth dielectric layer 54 in the side openings 51 and a second conductive layer 56 may be formed covering the first conductive layer 55 and filling a remainder of the side openings 51.

First, however, the surface layer 54s of the fourth dielectric layer 54 may be removed. The surface layer 54s may be removed by a wet etch process using a wet etchant of an HF solution, a peroxyacetyl nitrate (PAN) solution, a standard clean 1 (SC1) solution, a phosphoric acid solution, or a sulfuric acid solution. Alternatively, the surface layer 54s may be removed by a dry etch process using an etch gas comprising $NF_3$, $NH_3$, or HF, or a plasma formed of any one thereof.

The first conductive layer 55 is deposited on the fourth dielectric layer 54 from which the surface layer 54s has been removed. In this case, an incubation time may be shorter compared to a case (hereinafter, referred to as 'a comparative case') in which the first conductive layer 55 is deposited on the surface layer 54s. Accordingly, the first conductive layer 55 may be uniformly deposited to a thickness less than that of the comparative case, i.e., the first conductive layer 55 can be thinner than the first conductive layer 55 in the comparative case. Therefore, the potential for the forming of a slit in the second conductive layer 56 during the subsequent deposition process is reduced, as is likelihood of the third dielectric layer 27 being melted due to fluorine ($F_2$) gas remaining in a slit in the second conductive layer 56.

Figure 3H:
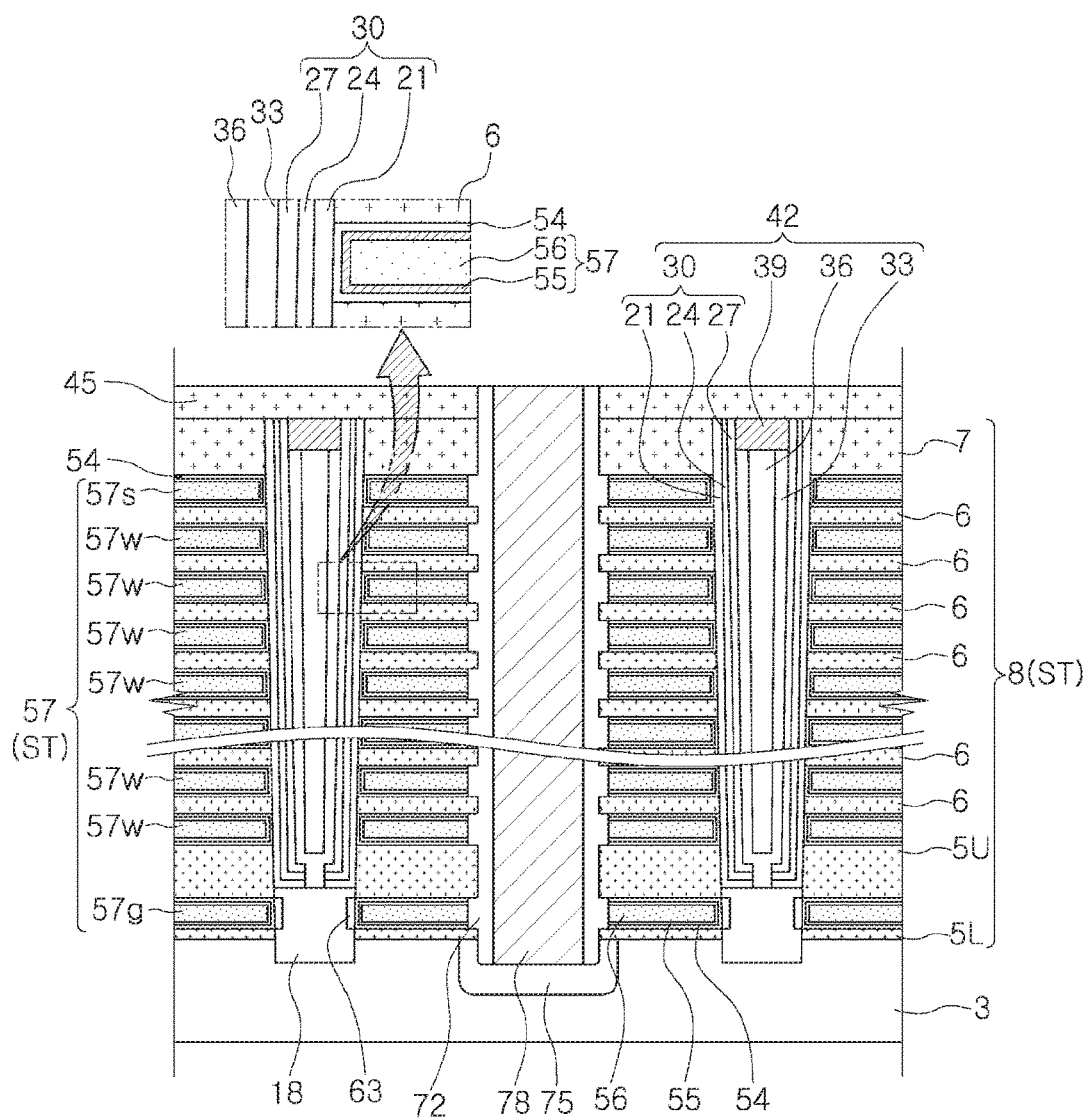

With reference to FIG. 3H, sections of conductive patterns 57 separated from each other may be formed. In addition, a separation pattern 78 may be formed between the sections of conductive patterns 57.

The individual sections of conductive patterns 57 may be formed by removing the first conductive layer 55 and the second conductive layer 56 from the separation trench (52 of FIG. 3G) and likewise removing the fourth dielectric layer 54 from the separation trench. As a result, block-shaped structures each comprising a stack of conductive patterns 57 and separated from each other by separation patterns 78 may be formed on the substrate 3.

An insulating spacer 72 may be formed along sides of the separation trench (52 of FIG. 3G). An ion implantation process may be performed to form an impurity region 75 in the substrate 3 below the separation trench (52 of FIG. 3G). The impurity region 75 may be formed to have n-type conductivity. A conductive material may be deposited to fill the separation trench (52 of FIG. 3G) and planarized, thus forming the separation pattern 78. The conductive material forming the separation pattern 78 may be a metallic nitride, a metallic silicide, a metal or combinations thereof.

With reference to FIGS. 1 and 2, the second upper insulating layer 81 may be formed on the first upper insulating layer 45 and the separation pattern 78. A contact plug 84 may be formed through the first upper insulating layer 45 and the second upper insulating layer 81 and electrically connected to the conductive pad 39 of the vertical structure 42. The contact plug 84 may be formed of a metallic silicide, a metallic nitride and/or a metal. A bit line 87 may be formed on the second upper insulating layer 81 as electrically connected to the contact plug 84. The bit line 87 may be of conductive material, such as a metallic nitride (e.g., titanium nitride (TiN), tantalum nitride (TaN), or the like) and/or a metal (e.g., tungsten (W), aluminum (Al), copper (Cu), or the like).

In these examples of a semiconductor device, according to the present inventive concept, the conductive patterns 57, the vertical structure 42, the bit line 87, and the impurity region 75, on the substrate 3, may form a memory cell array. A peripheral circuit region electrically connected to the memory cell array region may be disposed on the substrate 3. The peripheral circuit region may include a plurality of transistors. The peripheral circuit region may extend around the memory cell array but the inventive concept is not limited thereto.

Figure 4:
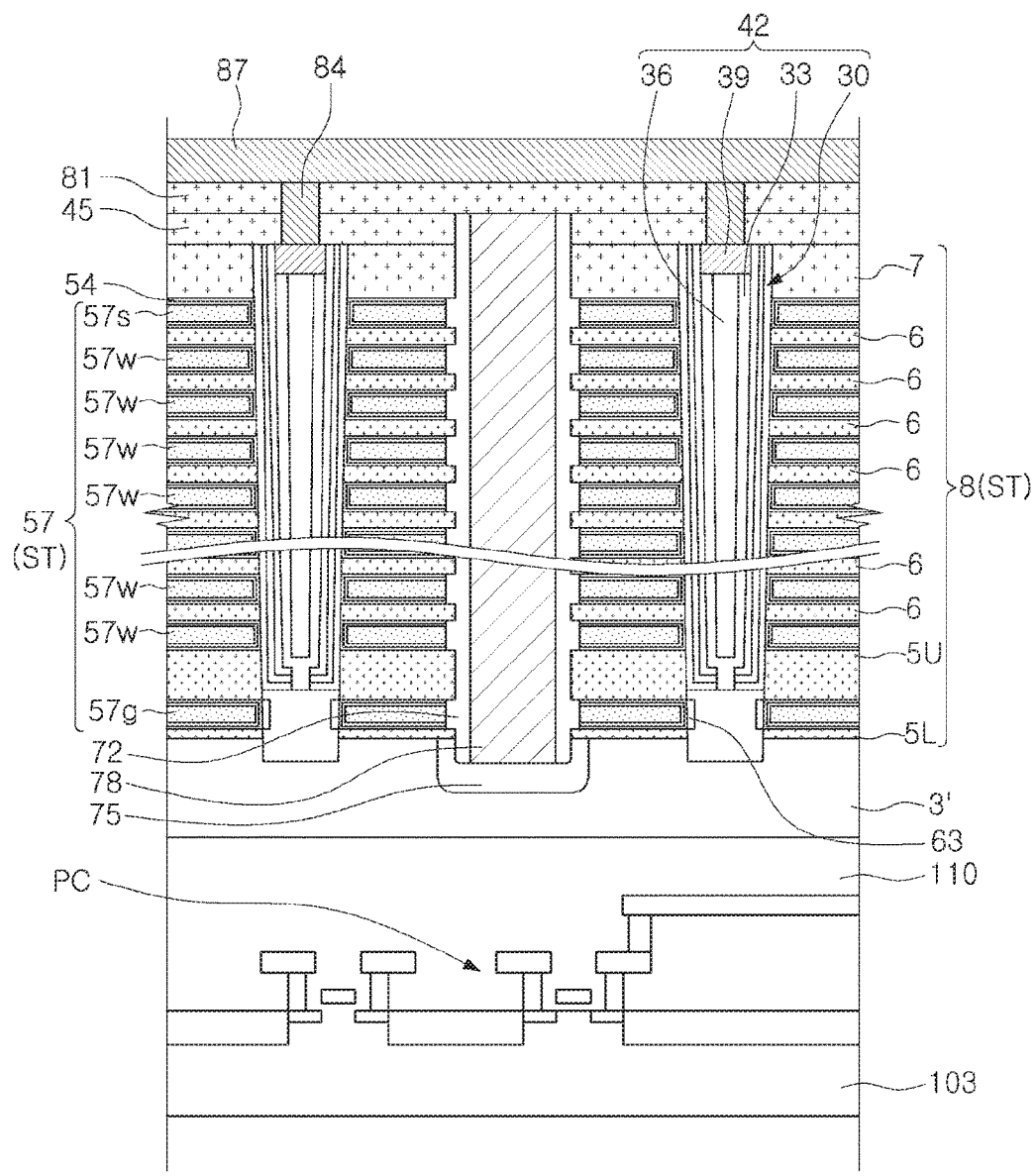
FIG. 4 is a cross-sectional view of an example of a semiconductor device according to the present inventive concept.

FIG. 4 is a cross-sectional view of an example of a semiconductor device according to the present inventive concept.

With reference to FIG. 4, a memory cell array may include conductive patterns 57, a vertical structure 42, a bit line 87, and an impurity region 75, on a substrate 3'. A peripheral circuit region PC may be disposed below the memory cell array. In more detail, the substrate 3' may include an amorphous or polycrystalline semiconductor material.

The peripheral circuit region PC may include a peripheral circuit formed on a base substrate 103. The base substrate 103 may be a semiconductor substrate. The peripheral circuit may be covered with a lower insulating layer 110 disposed between the base substrate 103 and the substrate 3'.

Figure 5:
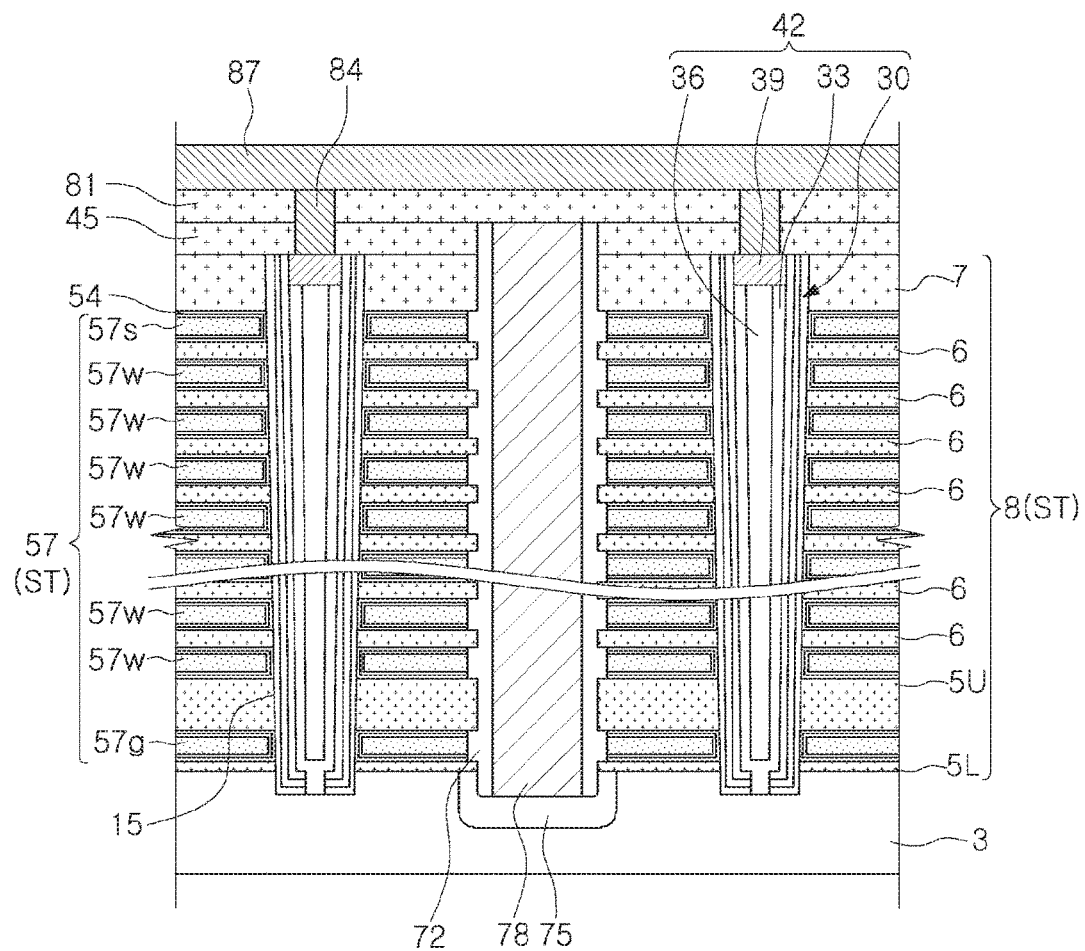
FIG. 5 is a cross-sectional view of an example of a semiconductor device according to the present inventive concept.

FIG. 5 is a cross-sectional view of an example of a semiconductor device according to the present inventive concept.

The semiconductor device, illustrated in FIG. 5 differs from the semiconductor device, illustrated in FIG. 2, in that a semiconductor pattern 18 below a vertical structure 42 is not present. The semiconductor device illustrated in FIG. 5 may be manufactured in a manner similar to that described above with reference to FIGS. 3A-3H except that that the SEG process shown in and described with reference to FIG. 3A is not performed, whereas the processes shown in and described in FIGS. 3B to 3H are performed.

Figure 6:
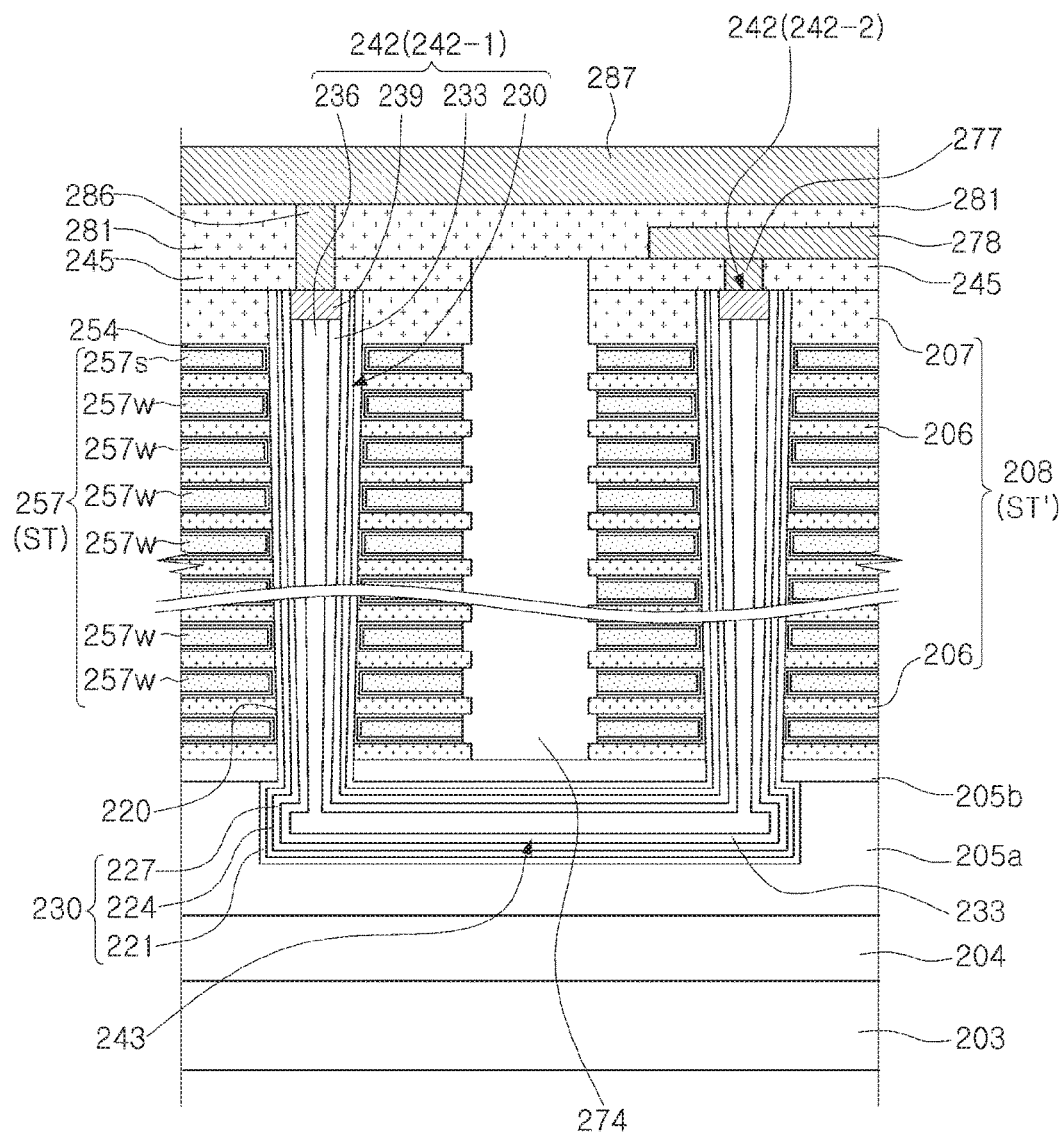
FIG. 6 is a cross-sectional view of an example of a semiconductor device according to the present inventive concept.

FIG. 6 is a cross-sectional view of an example of a semiconductor device according to the present inventive concept.

With reference to FIG. 6, a lower insulating layer 204 may be disposed on a substrate 203. A first back gate electrode layer 205a and a second back gate electrode layer 205b may be disposed on the lower insulating layer 204 in the foregoing sequence. In more detail, the first back gate electrode layer 205a and the second back gate electrode layer 205b may be formed of a semiconductor material, such as doped silicon, or the like. The first back gate electrode layer 205a and the second back gate electrode layer 205b may be referred to as a first pipe electrode layer and a second pipe electrode layer, respectively.

Stacked structures ST' may be disposed on the second back gate electrode layer 205b as spaced horizontally apart from each other. The stacked structures ST' may include mold insulating layers 208 and conductive patterns 257, alternately stacked. The mold insulating layers 208 may include lower mold insulating layers 206 and an upper mold insulating layer 207 on the lower mold insulating layers 206. The upper mold insulating layer 207 may be thicker than each of the lower mold insulating layers 206. The conductive patterns 257 may be interposed between the mold insulating layers 208.

An uppermost one of the conductive patterns 257s may be provided as a select gate electrode or a select gate line. Conductive patterns 257w below the uppermost conductive pattern 257s may be provided as cell gate electrodes or word lines.

A first upper insulating layer 245 and a second upper insulating layer 281 may be stacked on the stacked structures ST' in the foregoing sequence.

A vertical separation pattern 274 may divide the first upper insulating layer 245 and separate the stacked structures ST' from each other. The separation pattern 274 may be formed of an insulating material, such as a silicon oxide, or the like.

Vertical structures 242 may extend through the stacked structures ST'. The vertical structures 242 may include a first vertical structure 242_1 and a second vertical structure 242_2, facing each other, with the separation pattern 274 disposed therebetween.

The first vertical structure 242_1 and the second vertical structure 242_2 may be connected to each other through a connection structure 243 extending in a horizontal direction from lower regions of the first vertical structure 242_1 and the second vertical structure 242_2. The connection structure 243 may be embedded in the first back gate electrode layer 205a and the second back gate electrode layer 205b.

The first vertical structure 242_1 and the second vertical structure 242_2 may include a gap-fill insulating layer 236, a semiconductor layer 233, a dielectric structure 230, and conductive pads 239. The connection structure 243 may include the gap-fill insulating layer 236, the semiconductor layer 233, and the dielectric structure 230.

In the first vertical structure 242_1, the second vertical structure 242_2, and the connection structure 243, the gap-fill insulating layer 236, the semiconductor layer 233, and the dielectric structure 230 may extend through the stacked structures ST' and be connected below the stacked structures ST' and the separation pattern 274. The semiconductor layer 233 may be interposed between the gap-fill insulating layer 236 and the dielectric structure 230. The conductive pads 239 may be disposed in upper regions of the first vertical structure 242_1 and the second vertical structure 242_2, respectively, and may be connected to the semiconductor layer 233. The conductive pads 239 may be formed of polysilicon having n-type conductivity. The dielectric structure 230 may include a first dielectric layer 221, a second dielectric layer 224, and a third dielectric layer 227, extending to the connection structure 243. The first dielectric layer 221, the second dielectric layer 224, and the third dielectric layer 227 may correspond to the first dielectric layer 21, the second dielectric layer 24, and the third dielectric layer 227, of the example of FIG. 2, respectively.

A bit line 287 may be disposed on the second upper insulating layer 281. A bit line contact plug 286 may be interposed between the bit line 287 and the first vertical structure 242_1. A source line 278 may be disposed on the first upper insulating layer 245. A source contact plug 277 may be interposed between the source line 278 and the second vertical structure 242_2.

Figure 7A:
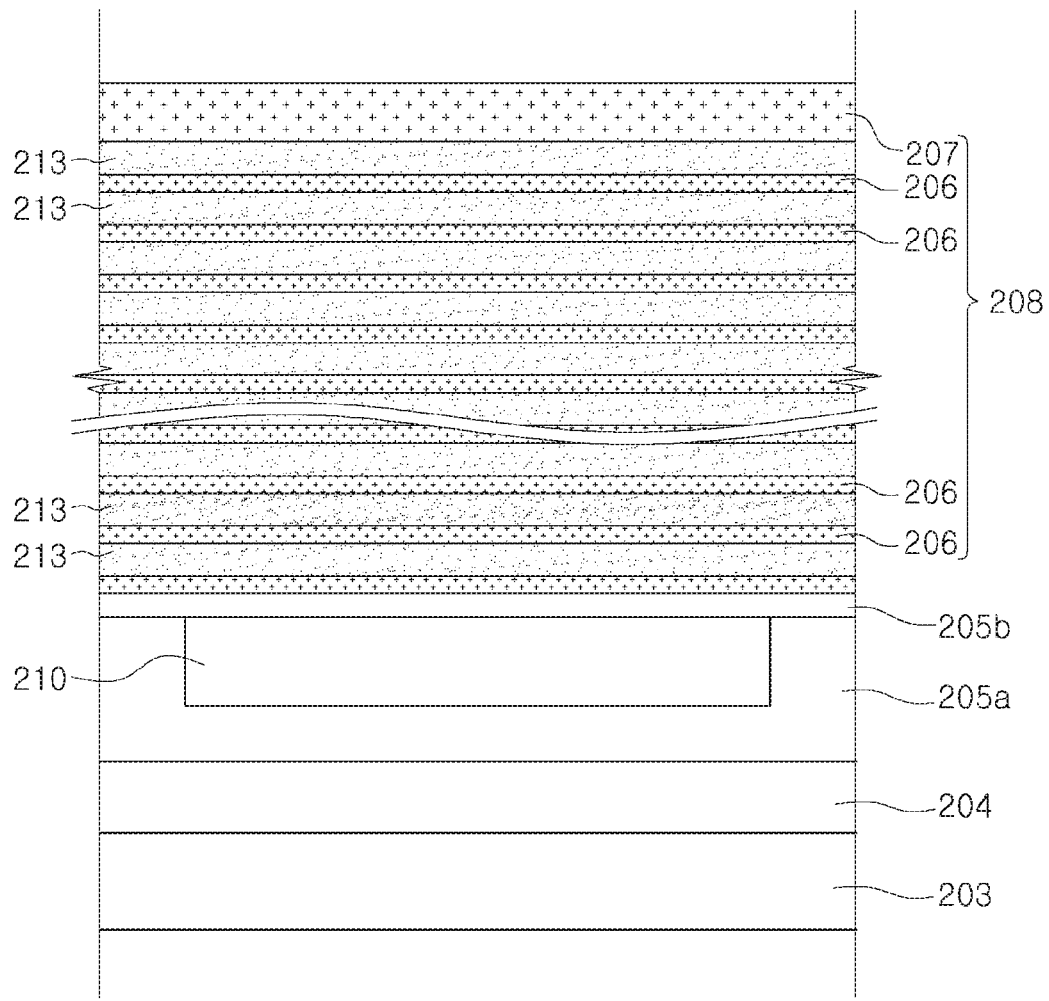
FIGS. 7A, 7B and 7C are cross-sectional views of a semiconductor device during the course of its manufacture and together illustrate an example of a method of manufacturing a semiconductor device according to the present inventive concept.
Figure 7B:
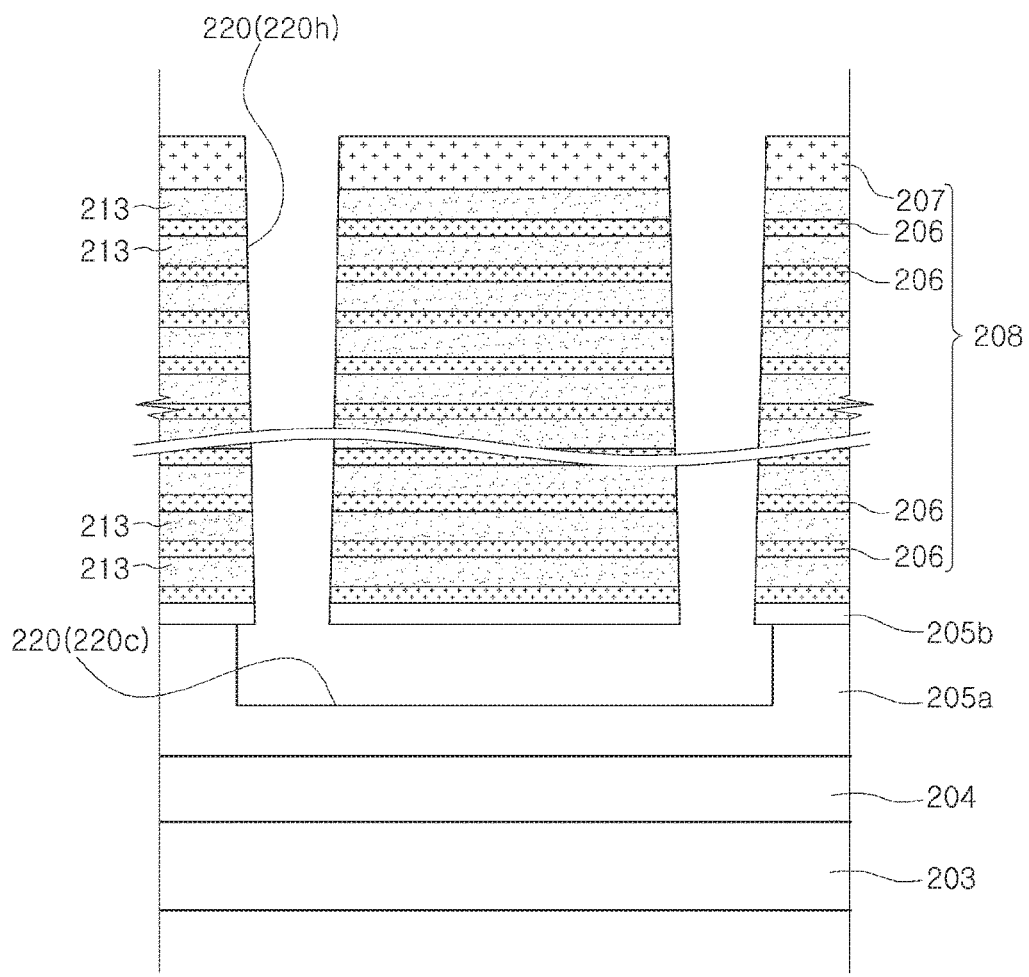
Figure 7C:
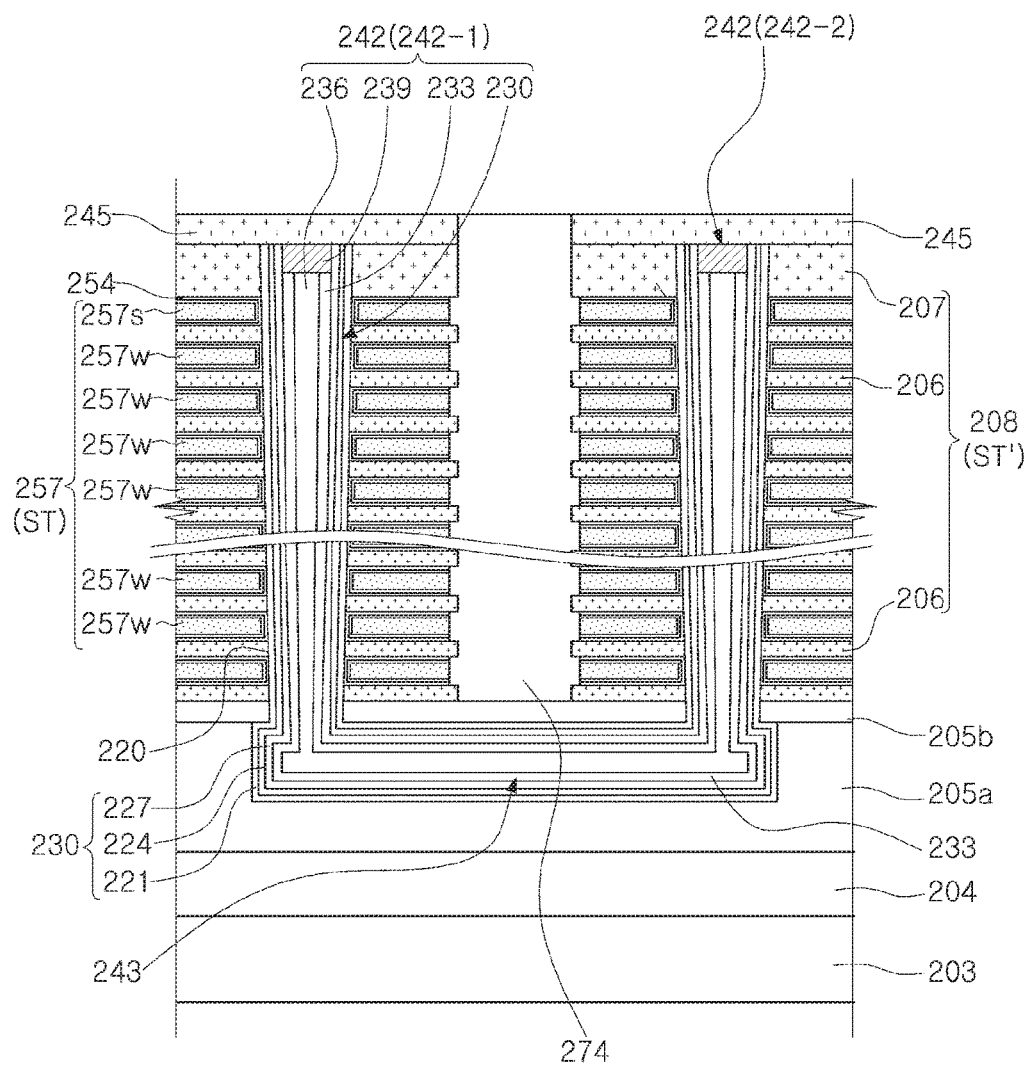

FIGS. 7A to 7C illustrate an example of a method of manufacturing a semiconductor device according to the present inventive concept. The method of will be described hereinafter with reference to the manufacturing of the example of a semiconductor device of FIG. 6.

With reference to FIG. 7A, a lower insulating layer 204 may be formed on a substrate 203. A first back gate electrode layer 205a and a second back gate electrode layer 205b may be formed on the lower insulating layer 204. A sacrificial pattern 210 may be formed on the lower insulating layer 204 before the first back gate electrode layer 205a is formed so as to be embedded in the first back gate electrode layer 205a. Then the second back gate electrode layer 205b may be formed to cover the first back gate electrode layer 205a and the sacrificial pattern 210. The sacrificial pattern 210 may be formed using a material having etching selectivity with respect to the first back gate electrode layer 205a and the second back gate electrode layer 205b. Mold insulating layers 208 and sacrificial layers 213 may be formed as alternately stacked on the second back gate electrode layer 250b. An uppermost mold insulating layer 207 may be formed to be thicker than the other mold insulating layers 206.

Figure 9A:
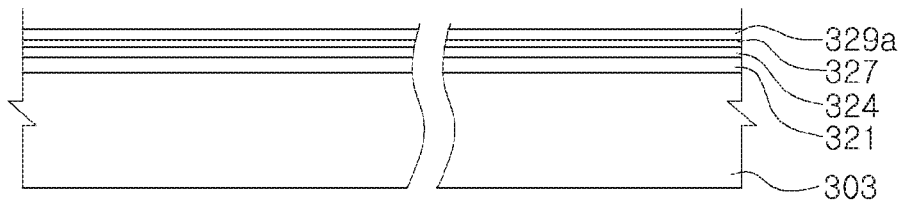
FIGS. 9A, 9B, 9C and 9D are cross-sectional views of a semiconductor device during the course of its manufacture and together illustrate an example of a method of manufacturing a semiconductor device according to the present inventive concept.

With reference to FIG. 7B, channel holes 220h may be formed through the mold insulating layers 208 and the sacrificial layers 213 to expos the sacrificial pattern (210 of FIG. 9A). Subsequently, the sacrificial pattern (210 of FIG. 9A) exposed by the channel holes 220h may be removed, thus forming a connection opening 220c. The channel holes 220h and the connection opening 220c may be collectively referred to simply as an opening 220.

With reference to FIG. 7C, a first dielectric layer 221, a second dielectric layer 224, a third dielectric layer 227, and a semiconductor layer 233 may be formed on the substrate 203 including in the opening 220, in the foregoing sequence. A gap-fill insulating layer 236 may be formed on the semiconductor layer 233 to fill the remainder of the opening 220, and the gap-fill insulating layer 236 may be recessed. Conductive pads 239 may be formed in the recesses in the gap-fill insulating layer. The first dielectric layer 221, the second dielectric layer 224, and the third dielectric layer 227 may form a dielectric structure 230.

The dielectric structure 230, the semiconductor layer 233, the gap-fill insulating layer 236, and the conductive pad 239, formed in the channel holes 220h of the opening 220, may be referred to as vertical structures 242. In addition, the dielectric layer 230, the semiconductor layer 233, and the gap-fill insulating layer 236, formed in the connection opening 224c, may be referred to as a connection structure 243.

The first dielectric layer 221, the second dielectric layer 224, and the third dielectric layer 227 may be formed using a method similar to that of forming the first dielectric layer 21, the second dielectric layer 24, and the third dielectric layer 27, as shown in and described with reference to FIG. 3B. The semiconductor layer 233, the gap-fill insulating layer 236, and the conductive pad 239 may be formed using a method similar to that of forming the semiconductor layer 33, the gap-fill insulating layer 36, and the conductive pad 39, as shown in and described with reference to FIG. 3C.

A first upper insulating layer 245 may be formed covering the uppermost mold insulating layer 207 and the vertical structures 242. A vertical separation trench dividing the first upper insulating layer 245, the mold insulating layers 208, and the sacrificial layers 213 may be formed.

Subsequently, a process similar to that shown in and described with reference to FIGS. 3D to 3H may be performed. However, the separation trench may be filled with an insulating material, thus forming a separation pattern 274.

With reference to FIG. 6, a source contact plug 277 electrically connected to one of the conductive pads 239 on one of the vertical structures 242 and a source line 278 electrically connected to the source contact plug 277 may be formed. A second upper insulating layer 281 covering the source line 278 and the first upper insulating layer 245 may be formed. A bit line contact plug 286 extending through the first upper insulating layer 245 and the second upper insulating layer 281 and electrically connected to the conductive pad on the other of the vertical structures 242, but not the source contact plug 277, may be formed. A bit line 287 electrically connected to the bit line contact plug 286 may be formed.

Figure 8:
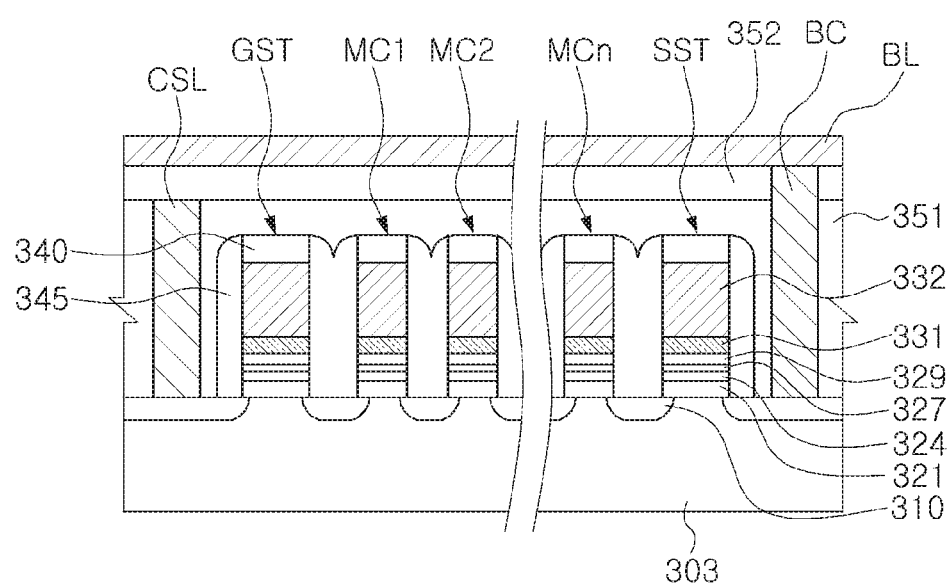
FIG. 8 is a cross-sectional view of an example of a semiconductor device according to the present inventive concept.

FIG. 8 is a cross-sectional view of an example of a semiconductor device according to the inventive concept. The semiconductor device, illustrated in FIG. 8, may include a planar structure of memory cells each having comprising a transistor including a charge trapping layer as part of its gate dielectric.

With reference to FIG. 8, the semiconductor device may include a string select transistor SST connected to a bit line BL through a bit line contact BC, a ground select transistor GST connected to a common source line CSL, and memory cells MC1 to MCn disposed between the string select transistor SST and the ground select transistor GST. Gate stack structures of the memory cells MC1 to MCn may extend parallel (in the direction into and out of the sheet in FIG. 8), thus forming word lines. The gate stack structures of the ground select transistor GST and the string select transistor SST may be extended parallel to the word lines, thus forming a ground select line and a string select line, respectively. The (gate stack structures of the) memory cells MC1 to MCn, the ground select transistor GST, and the string select transistor SST may include a first dielectric layer 321, a second dielectric layer 324, a third dielectric layer 327, and a fourth dielectric layer 329, formed on a substrate 303, and may include a first conductive layer 331 and a second conductive layer 332, formed on the fourth dielectric layer 329. The first conductive layer 331 and the second conductive layer 332 may form a gate electrode. The first dielectric layer 321, the second dielectric layer 324, the third dielectric layer 327, and the fourth dielectric layer 329 may form a gate dielectric.

The first dielectric layer 321, the second dielectric layer 324, the third dielectric layer 327, and the fourth dielectric layer 329 may correspond to the first dielectric layer 21, the second dielectric layer 24, the third dielectric layer 27, and the fourth dielectric layer 54, in the example of FIG. 2.

A gate spacer 340 may be disposed on sides of the gate structures. The substrate 303 may include an impurity region 310 (a region of the substrate doped with an impurity) below the gate spacer 340. In addition, the impurity region 310 may be disposed in the substrate 303 beneath the bit line contact BC and the common source line CSL.

FIGS. 9A to 9D illustrate an example of a method of manufacturing a semiconductor device according to the present inventive concept. The method will be described hereinafter with reference to the manufacturing of the semiconductor device illustrated in FIG. 8.

With reference to FIG. 9A, a first dielectric layer 321, a second dielectric layer 324, a third dielectric layer 327, and a preliminary dielectric layer 329a may be formed on a substrate 303 in the foregoing sequence. The first dielectric layer 321, the second dielectric layer 324, and the third dielectric layer 327 may be formed using a method substantially the same as a method of forming the first dielectric layer 21, the second dielectric layer 24, and the third dielectric layer 27, described with reference to FIG. 3B. The preliminary dielectric layer 329a may be formed using a method substantially the same as a method of forming the preliminary dielectric layer 54a described with reference to FIG. 3E. The preliminary dielectric layer 329a may be an amorphous oxide film. In more detail, the preliminary dielectric layer 329a may be an amorphous aluminum oxide film.

Figure 9B:
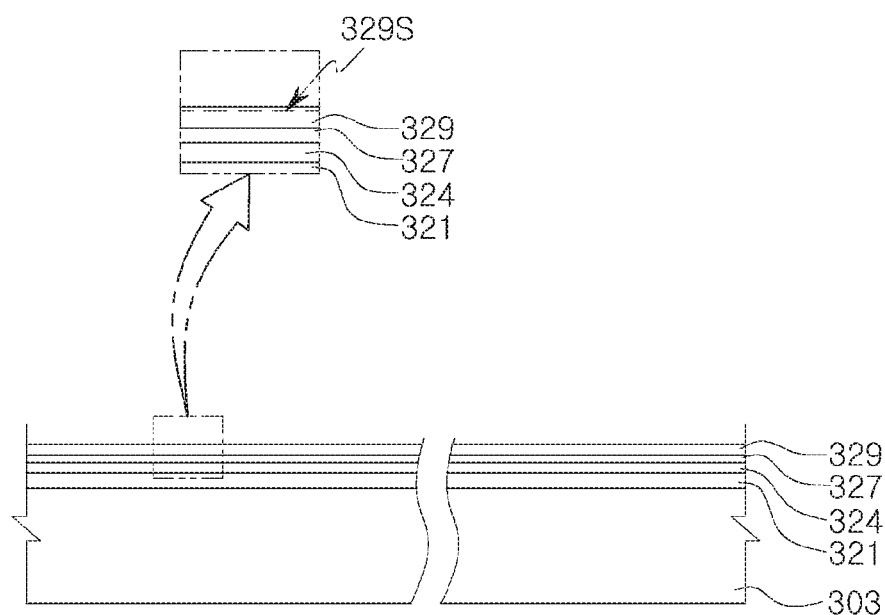

With reference to FIG. 9B, a process substantially the same as that described with reference to FIG. 3F may be performed. Briefly, the preliminary dielectric layer 329a may be heat-treated to form a crystallized fourth dielectric layer 329. The fourth dielectric layer 329 may have a surface layer 329s having a relatively low degree of crystallization.

Figure 9C:
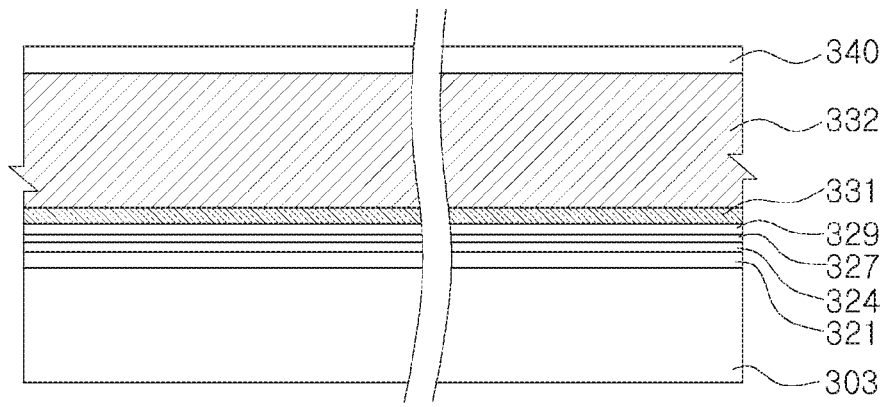

With reference to FIG. 9C, the surface layer 329s of the fourth dielectric layer 329 may be removed, and a first conductive layer 331, a second conductive layer 332, and a hard mask layer 340 may be formed in on the resulting structure in the foregoing sequence.

A method of removing the surface layer 329s may be substantially the same as a method described with reference to FIG. 3G. That is, the surface layer 329s may be removed using an HF solution, a PAN solution, SC1 solution, a phosphoric acid solution, or a sulfuric acid solution. Alternatively, the surface layer 329s may be removed using an NF$_3$ etch gas, an NH$_3$ etch gas, an HF etch gas, or a plasma formed of any one thereof.

The first conductive layer 331 may include a metallic nitride, such as TiN, or the like, while the second conductive layer 332 may include a metal, such as W.

Figure 9D:
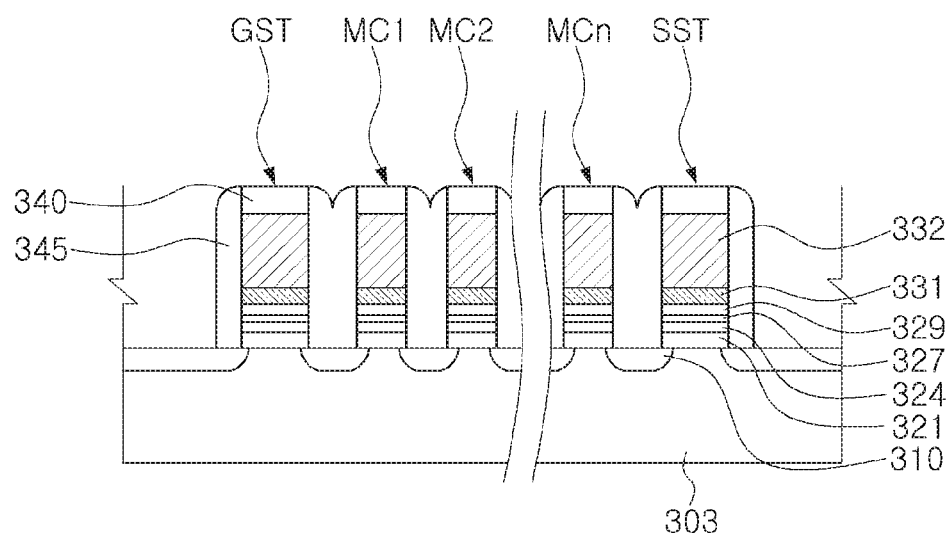

With reference to FIG. 9D, a hard mask layer 340 may be patterned, and the first conductive layer 331, the second conductive layer 332, the first dielectric layer 321, the second dielectric layer 324, the third dielectric layer 327, and the fourth dielectric layer 329 may be anisotropically etched, using the hard mask layer 340 as an etching mask, to form spaced apart gate structures. The gate structures may be linear structures extending in a first direction parallel to each other on the substrate 303 as spaced apart in a second direction (right to left in FIG. 9) perpendicular to the first direction. An ion implantation process may be performed on the substrate 303 exposed by the anisotropic etching process described above, thus forming an impurity region 310. A gate spacer 345 may then be formed on sides of the gate structures.

With reference to FIG. 8, the first interlayer insulating layer 351, the common source line CSL, a the second interlayer insulating layer 352, and the bit line contact BC and a bit line BL may be formed by process that are conventional, per se, e.g., deposition and etching processes, as would be readily apparent to those of ordinary skill in the art.

As described above, the present inventive concept allows for a semiconductor device having a reduced amount of process defects related to a gate electrode layer and facilitating vertical scaling down to be provided.

Although examples of the present inventive concept have been shown and described above, it will be apparent to those skilled in the art that modifications and variations could be made to the examples without departing from the scope of the present inventive concept as defined by the appended claims.

What is claimed is:

1. A method of manufacturing a semiconductor device, comprising:
   forming a mold structure, including alternately stacked mold insulating layers and sacrificial layers, on a substrate;
   forming a vertical structure extending through the mold structure;
   forming side openings by removing the sacrificial layers;
   forming a preliminary dielectric layer in the side openings;
   forming a dielectric layer by heat-treating the preliminary dielectric layer;
   removing a surface layer of the dielectric layer;
   forming a first conductive layer covering the dielectric layer in the side openings; and
   forming a second conductive layer covering the first conductive layer and filling a remainder of the side openings.

2. The method of claim 1, wherein the removing of a surface layer of the dielectric layer comprises wet etching the dielectric layer using an HF solution, a peroxyacetyl nitrate (PAN) solution, standard clean 1 (SC1) solution, a phosphoric acid solution, or a sulfuric acid solution.

3. The method of claim 1, wherein the removing of a surface layer of the dielectric layer comprises dry etching the dielectric layer using an etch gas or a plasma comprising one of $NF_3$, $NH_3$, and HF.

4. The method of claim 1, wherein the forming of a dielectric layer by heat-treating the preliminary dielectric layer comprises a spike rapid annealing process, performed in an inert gas atmosphere or an oxygen atmosphere, that crystallizes the preliminary dielectric layer.

5. The method of claim 1, wherein the forming of a vertical structure comprises forming a channel hole through the mold structure and exposing the substrate, forming a dielectric structure in the channel hole, forming a semiconductor layer extending through a lower portion of the dielectric structure and connected to the substrate, and forming conductive pads on the semiconductor layer.

6. The method of claim 1, further comprising epitaxially growing a layer from the substrate, and wherein the vertical structure is formed on the epitaxially grown layer.

7. The method of claim 1, wherein the preliminary dielectric layer is formed of an amorphous metal oxide film.

8. The method of claim 7, wherein the amorphous metal oxide film is an amorphous aluminum oxide film.

9. The method of claim 1, wherein the forming of side openings by removing the sacrificial layers comprises forming a separation trench through the mold structure to divide the mold structure into sections and expose the sacrificial layers, and removing the sacrificial layers exposed by the separation trench.

10. The method of claim 9, further comprising forming an insulating spacer along surfaces defining sides of the separation trench, and forming a separation pattern filling the separation trench.

11. A method of manufacturing a semiconductor device, comprising:

forming a gate dielectric on a substrate; and forming a gate electrode, wherein the forming of the gate dielectric includes sequentially forming layers of different dielectric materials including an amorphous metal oxide film, heat-treating the amorphous metal oxide film until the amorphous metal oxide film crystallizes, and etching away a surface layer of the metal oxide film that has crystallized, and the forming of the gate electrode includes forming a layer of metal against a portion of the metal oxide film remaining after the surface layer has been etched away, wherein the amorphous metal oxide film is an amorphous film of an aluminum oxide.

12. The method of claim 11, wherein the etching is a wet etch process of removing the surface layer with an HF solution, a peroxyacetyl nitrate (PAN) solution, standard clean 1 (SC1) solution, a phosphoric acid solution, or a sulfuric acid solution.

13. The method of claim 11, wherein the etching is a dry etch process of removing the surface layer with an etch gas or a plasma comprising one of $NF_3$, $NH_3$, and HF.

14. The method of claim 11, wherein the heat-treating comprises subjecting the amorphous metal oxide film to a spike rapid annealing process in an inert gas atmosphere or an oxygen atmosphere.

* * * * *